United States Patent

Gupta

Patent Number: 6,140,415
Date of Patent: Oct. 31, 2000

[54] WATER SOLUBLE THERMOPLASTIC PRINTED WIRING BOARD SPACER

[75] Inventor: Gyanendra Gupta, Plano, Tex.

[73] Assignee: Texas Instruments Incorporated, Dallas, Tex.

[21] Appl. No.: 08/474,950

[22] Filed: Jun. 7, 1995

Related U.S. Application Data

[62] Division of application No. 08/063,819, May 20, 1993, Pat. No. 5,906,776, which is a division of application No. 08/063,834, May 20, 1993, Pat. No. 5,324,474, which is a continuation of application No. 07/780,684, Oct. 18, 1991, abandoned.

[51] Int. Cl.$^7$ .................................... C08F 16/06
[52] U.S. Cl. .................. 525/56; 525/57; 264/331.15
[58] Field of Search .................. 525/57, 56; 264/331.15

[56] References Cited

U.S. PATENT DOCUMENTS

| | | | |
|---|---|---|---|
| 3,300,546 | 1/1967 | Baechtold | 260/876 |
| 4,228,250 | 10/1980 | Pritchett | 525/57 |
| 4,481,326 | 11/1984 | Sonenstein | 525/57 |
| 4,692,494 | 9/1987 | Sonenstein | 525/57 |
| 4,904,509 | 2/1990 | Nohara et al. | 525/57 |
| 5,436,293 | 7/1995 | Hayes et al. | 525/57 |

*Primary Examiner*—Cathy F. Lam
*Attorney, Agent, or Firm*—Wade James Brady, III; Frederick J. Telecky, Jr.

[57] ABSTRACT

Thermoplastic printed wiring board spacers are fabricated by providing a water soluble partially hydrolyzed polyvinyl alcohol resin or fully hydrolyzed polyvinyl alcohol resin or a blend of partially hydrolyzed polyvinyl alcohol resin and fully hydrolyzed polyvinyl alcohol resin, the ratio thereof depending upon (1) the degree of hydrolyzation of the polyvinyl alcohol resins, (2) crystallinity associated with particular polyvinyl alcohol resins, (3) the fabrication temperatures of the printed wiring board to avoid spacer melting and (4) the degree of solubility in water of the spacer. The spacers are fabricated by injection molding the polyvinyl alcohol resins or desired polyvinyl alcohol resin mixture to provide a molded configuration having a runner system with spacers attached to a sub runner system by a very thin gate. The spacers are removed from the molded configuration by initially cooling the surface of the total molded configuration to a temperature at which the thin gate sections becomes very brittle. The cooled molded configuration is then subjected to tumbling or a jolt whereby the spacers break away from the runner system at the gates. As an alternative embodiment, the spacers as molded include ridges and recessed areas therein along one or preferably both opposite surfaces which, when in placed around component leads, permit gases emitted during the soldering process to have an avenue of escape and provide for increased exposed surface area to prevent premature melting of the spacer by keeping it cool during flow/wave solder process and provide greater surface area available to the solvent, resulting in more rapid dissolving of the spacer material during the spacer removal step.

16 Claims, 2 Drawing Sheets

WATER SOLUBLE THERMOPLASTIC PRINTED WIRING BOARD SPACER

This is a divisional application of prior application Ser. No. 08/063,819 filed on May 20, 1993 now U.S. Pat. No. 5,906,776, which is a division of application Ser. No. 08/063,834 filed on May 20, 1993 which is now U.S. Pat. No. 5,324,474 which is a continuation of application Ser. No. 07/780,684 filed on Oct. 18, 1991 which is now abandoned.

BACKGROUND OF THE INVENTION

1. Field of the Invention

This invention relates to water soluble printed wiring board (PWB) spacers and more specifically to water soluble PWB spacers of thermoplastic materials which can be mass produced using one of the melt processable techniques applicable to thermoplastics such as injection molding.

2. Brief Description of the Prior Art

Mounts and spacers are often required to provide spacing for the electronic components at various elevations above PWBs. The purpose of these mounts and spacers is as follows:

(1) Provide adequate air space and lead length for heat dissipation to prevent operational overheating.

(2) Ability to clean under parts. Cleanability is an important design concern. Sufficient spacing between the part and the board will ensure that the cleaning solvent or aqueous cleaner can flow under the part and prevent entrapment of contaminants. As greater lead numbers and finer lead pitches are used, it becomes harder to force the cleaning solvents under the part.

(3) Provide mechanical protection. Eliminate lead stresses and improve shock and vibration characteristics.

(4) Simplify assembly, touch-up and repair work accessibility to leads for inspection.

The most common technique currently used to provide component spacing on the PWBs is with the use of mounts and spacers, produced from thermoplastics such as nylon. These mounts and spacers however become permanent to the printed wiring board assembly. The disadvantage include added cost of permanent mounts and spacers and An optional technique used for elevating electronic components of the printed wiring board is by placing a slight twist on the leads of electronic components. This method, commonly referred to as jog form, is labor intensive and is applicable to less than 30% of applications. This method also promotes leaning over of components which in turn leads to printed wiring board rework and/or scrap.

The most pertinent prior art of which applicant herein is aware involves wash away spacers compounded of organic material (lactose) for spacing electronic components on printed wiring boards. The manufacturing technique of these spacers is unknown. Prior to flow/wave solder processing, the wash away spacers of various shapes and desired thickness are placed between electronic components and the printed wiring board to raise the electronic component height to a desired elevation. Most often the leads of the electronic components pass through the spacers inside diameter and finally through printed wiring board to keep spacer intact between the electronic component and the printed wiring board during flow solder process. The spacers can also be placed between electronic components and printed wiring board without leads passing therethrough to provide desired spacing between electronic components and the printed wiring board. These techniques can be expensive since lactose spacers are brittle, difficult to handle and can prematurely break before or during flow solder processing, creating massive rework and scrap of printed wiring boards.

SUMMARY OF THE INVENTION

In accordance with the present invention, the above noted problems of the prior art are eliminated and there is provided a relatively inexpensive to produce PWB spacer which is not brittle and subject to breakage, retains its shape at the PWB fabrication and soldering temperatures encountered, yet is water soluble and easily removed from the completed PWB.

Briefly, the desired water soluble thermoplastic PWB spacers are molded by using partially (approximately 88%) hydrolyzed polyvinyl alcohol resins with a melting range between 120° C.–200° C. and exhibit up to 24% crystallinity or by using fully (approximately 98%) hydrolyzed polyvinyl alcohol resins with a melting range between 150° C.–230° C. which exhibit up to 45% crystallinity. The partially hydrolyzed polyvinyl alcohol resins are cold water soluble, where as fully hydrolyzed polyvinyl alcohol resins are cold water insoluble.

Alternatively, a blend of the partially hydrolyzed polyvinyl alcohol resins and the fully hydrolyzed polyvinyl alcohol resins mentioned above can be used to alter the properties of the PWB spacers used in various applications. The ratio of the partially hydrolyzed polyvinyl alcohol resin to the fully hydrolyzed polyvinyl alcohol resin depends upon following factors:

1. The various temperatures involved during fabrication of the PWB to avoid premature melting of the spacers.

2. The degree of solubility in water required for the spacer.

A preferred source of partially hydrolyzed polyvinyl alcohol resin is 2000 series and 5000 series VINEX™ thermoplastic polyvinyl alcohol copolymer resins manufactured by Air Products and Chemicals, Inc., Polymer Chemicals Division, Allentown, Pa. 18195 USA.

A preferred source of fully hydrolyzed polyvinyl alcohol resin is 1000 series VINEX™ thermoplastic polyvinyl alcohol copolymer resins manufactured by Air Products and Chemicals, Inc., Polymer Chemicals Division, Allentown, Pa. 18195 USA.

The spacers in accordance with the present invention are preferably fabricated by injection molding. The desired neat polyvinyl alcohol resin or a blend described above is used to provide a molded configuration described hereinbelow. Each spacer is attached to the runner system with a tab or a edge gate.

The spacers are degated from the runner system by initially cooling the surface of the total runner system with parts attached to a temperature at which the gates become brittle. This is accomplished for example, by spraying liquid nitrogen over the surface of the entire runner system, whereby the thin gate sections reach essentially the temperature of the liquid nitrogen entirely therethrough and become very brittle. Tumbling of the runner system while liquid nitrogen is being sprayed thereon or immediately thereafter, causes parts to degate from the remainder of the runner system, breaking away at brittled thin gate sections. Parts can then be easily separated from the remaining runner system by using a wide mesh sieve which traps the runner system at the top thereof. Parts are collected into a container at the bottom of the sieve and placed into an oven at about 170° F. for 15–30 minutes and slowly cooled down to room temperature to prevent any condensation of moisture on the just degated spacers using liquid nitrogen technique.

As an alternate degating technique, the spacers can be automatically degated during molding operation by utilizing a sub-gate (tunnel gate).

In either technique the remainder of the runner system after degating the part can be pelletized and recycled into the molding process.

As an alternate embodiment, the spacers as molded can include ridges therein along one or preferably on both opposing surfaces. These ridges perform three functions as follows:

1. When in place around component leads, gases emitted during the soldering process will have an avenue of escape through the recessed area between the ridges.

This prevents and minimizes rejects due to solder defects in the finished printed wiring board assembly.

2. The ridges and recessed surfaces provide for increased exposed surface area, which helps prevent premature melting of the spacer by keeping it cool during flow/wave solder process. This prevents or minimizes rejects due to the components dropping down below acceptable limit in the finished printed wiring board assembly.

3. Greater surface area available to the water solvent during rinse and water wash step, results in more rapid dissolving of the spacer material. This helps in faster removal of the spacer from the printed wiring board assembly, and accounts for fabrication process to be cost effective.

DESCRIPTION OF THE PREFERRED EMBODIMENTS

Figure 1:
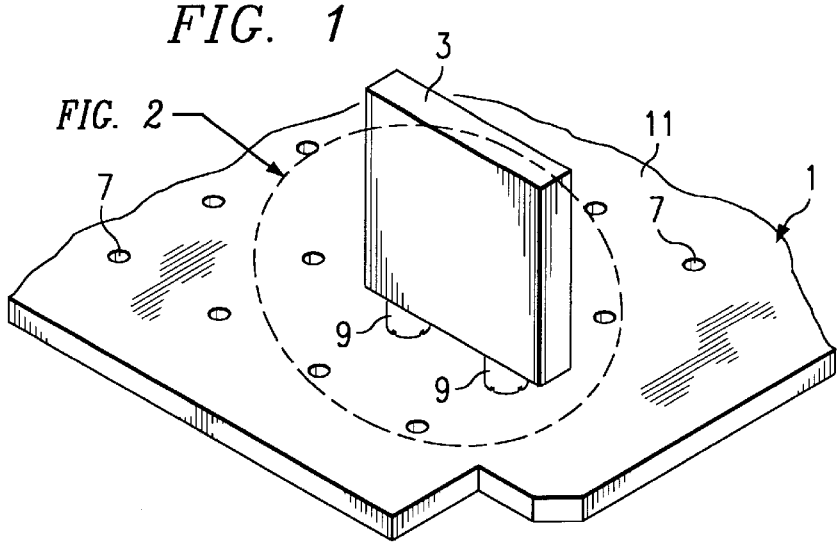
FIG. 1 is a perspective view of a printed wiring board having a component mounted thereon with a spacer between the component and the board.
Figure 2:
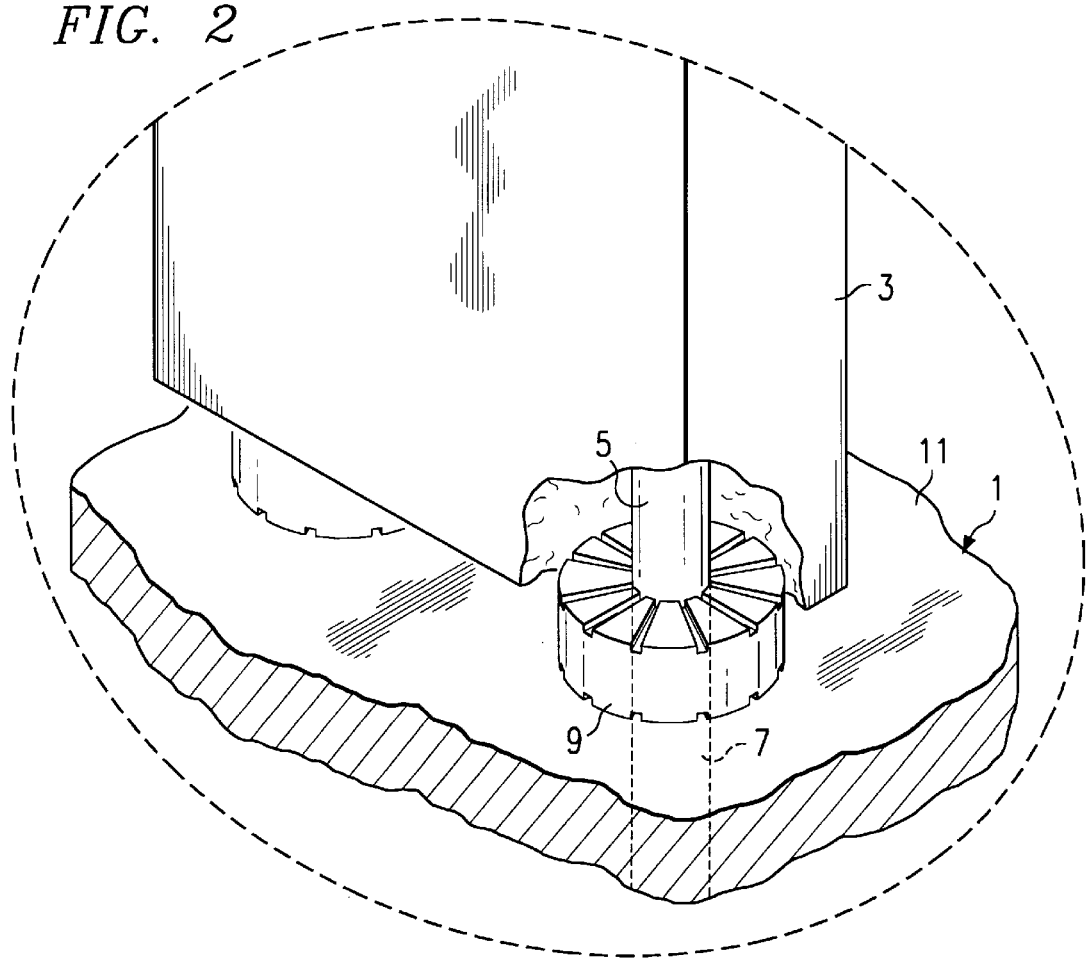
FIG. 2 is an enlarged view of a portion of FIG. 1.

Referring first to FIGS. 1 and 2, there is shown a printed wiring board 1 having a component 3, such as, for example, a resistor, capacitor, semiconductor, etc., having a lead 5 extending through an aperture 7 in the board with a spacer 9 disposed between the board surface 11 and the component 3 to maintain the component 3 spaced from the board surface 11 by the height of the spacer. (It should be understood that the spacer need not be apertured and merely need be positioned between the component 3 and the board 1 to provide the desired component spacing.) During fabrication of the PWB, the spacer 9 is placed around the lead 5 and the lead 5 is placed through the aperture 7 in the PWB so that the spacer is disposed between the surface 11 of the PWB and the component 3 as shown. It is understood that a typical PWB will generally have many such components 3 and apertures 7. Between standard pre-soldering the post-soldering steps, the PWB with components therein is passed through a soldering step, such as, for example, wave soldering, in standard manner to solder the lead 5 in the aperture 7. Any portion of the lead 5 extending below the PWB will then be severed and the PWB will then appear as shown in FIGS. 1 and 2. The PWB of FIGS. 1 and 2 is then passed through the water wash step to dissolve the spacer 9 in water to provide a final PWB with components 3 mounted thereon and spaced from the PWB surface as required.

The PWB spacer of FIGS. 1 and 2 is fabricated by first determining the temperatures to be encountered during the PWB fabrication process and determining the maximum amount of time available for dissolving the spacer in water at the end portion of the PWB fabrication process. From this data, and from the available data for the particular partially hydrolyzed and fully hydrolyzed polyvinyl alcohol resin, a tradeoff is made to use a neat resin or the ratio of each be used to concomitantly provide the desired spacer melting temperature and water solubility rates.

EXAMPLE 900 grams of partially (approximately 88%) hydrolyzed polyvinyl alcohol resin and 100 grams of fully (approximately 98%) hydrolyzed polyvinyl alcohol resin pallets were weighed and dry blended together in the form a salt and pepper mix.

Resin drying is recommended at 170° F. for 2–4 hrs. This can be accomplished in a fan forced convection oven or dehumidifying hopper dryer. The resin can be dried in the neat form prior to mixing or after mixing as a dry blend.

The neat resin or the desired blend ratio is fed into the hopper of the standard thermoplastic injection molding machine. Some process optimization is required for each different blend ratio.

Figure 3:
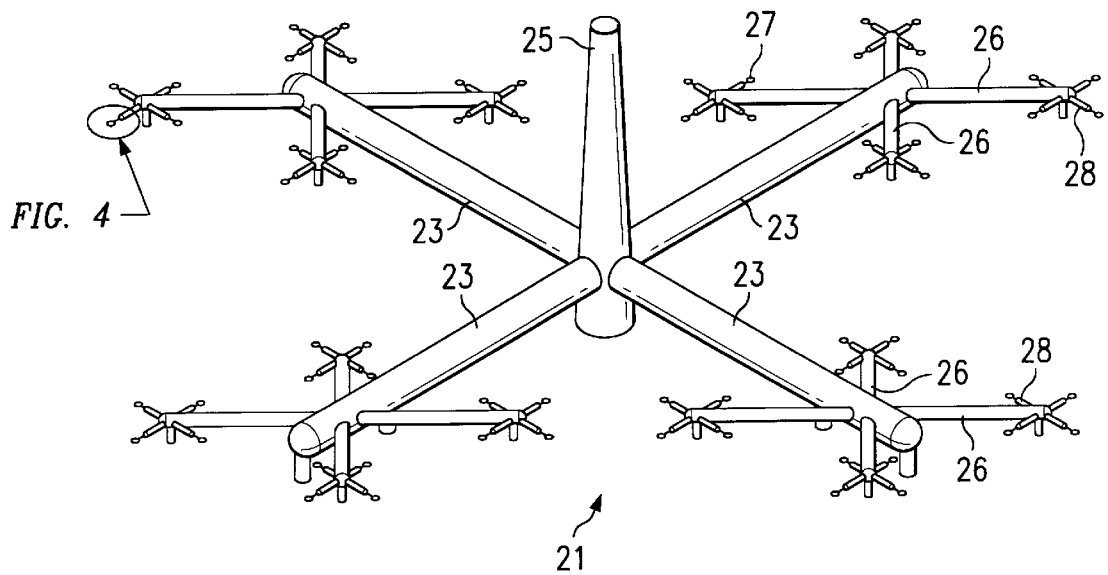
FIG. 3 is a perspective view of a molded configuration containing the PWB spacers of the present invention as a portion thereof.

The molded configuration 21 is illustrated in FIG. 3. Sprue 25, runner system 23 and sub-runner system 26 and 28 are shown. The donut shaped spacers (shown enlarged in FIG. 4) are molded in this example using a tab gate 29.

The spacers 27 are degated from the sub-runner system 28 by initially cooling the surface of the entire molded configuration 21 to a temperature at which the gates 29 become brittle. This is accomplished, for example, by spraying liquid nitrogen over the surface of the entire molded configuration 21, whereby the thin gate 29 sections reaches essentially the temperature of the liquid nitrogen entirely therethrough and becomes very brittle. Tumbling the entire molded configuration 21 or sections of runner system 23 while liquid nitrogen is being sprayed or immediately thereafter, causes parts to degate from the sub-runner system 28, breaking away at brittled thin gate sections. Spacers 27 can then be easily separated from the remaining molded configuration 21 by using a wide mesh sieve, which traps the waste at the top. Spacers 27 are collected in a container at the bottom and placed into an oven at 170° F. for 15–30 minutes and slowly allowed to cool down to a room temperature to prevent any condensation of moisture on the just degated spacers 27 using liquid nitrogen degating technique.

As an alternate degating technique, the spacers 27 can be automatically degated during the molding operation by utilizing a sub-gate (tunnel gate).

In either technique the remainder of the molded configuration 21, including sprue 25 runner system 23 and sub-runner system 26 and 28 can be pelletized and recycled into the molding process.

Figure 4:
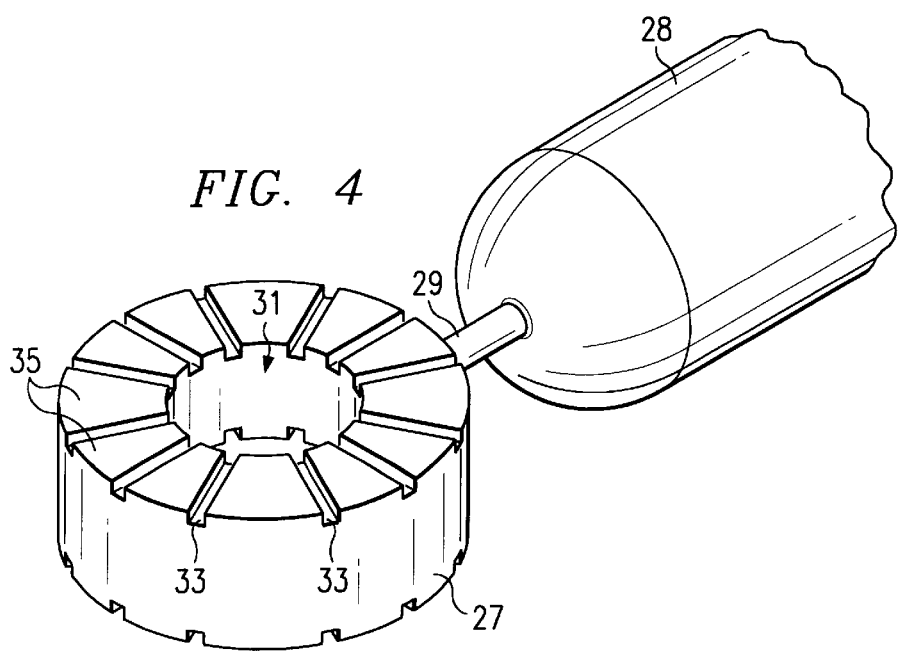
FIG. 4 is an enlarged view of a portion of FIG. 3.

With reference now to FIG. 4, while the spacer 27 can have a flat continuous outer surface as a first embodiment which is not shown, there is shown a second embodiment of a donut-shaped spacer in accordance with the present invention. This spacer is fabricated in the same manner as described above with reference to the spacer described in connection therewith. The difference herein is that the spacer 27 includes a central aperture 31 with ridges 35 on at least one surface thereof and preferably both opposite surfaces thereof and recessed surfaces 33 between the ridges. It can be seen that the spacer 27, when resting on the surface 11 of the PWB 1 of FIGS. 1 and 2, will have ridges 35 extending along the recessed surfaces 33 whereby gases emanating from the aperture 7 can travel through such recessed surfaces 33 to the exterior environment. In addition, since the exposed surface area of the spacer 27 is increased relative to the surface area of a spacer 27 without the ridges 35 and recessed surfaces 33, the spacer 27 will dissolve in water at a greater rate than will the spacer without ridges 35, thereby speeding up the fabrication process.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

APPENDIX

Attached hereto and incorporated by reference is a polymer chemicals technical bulletin for the VINEX™ thermoplastic polyvinyl alcohol copolymer resins 1000 Series, 2000 Series and 5000 Series which sets forth particular polyvinyl alcohol resins which can be used in accordance with the present invention.

  APPENDIX  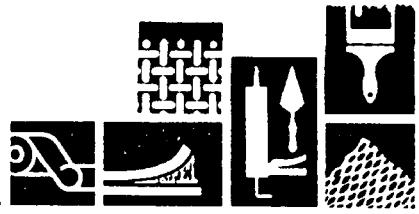

Polymer Chemicals Technical Bulletin

Vinex™ Thermoplastic Polyvinyl Alcohol Copolymer Resins
1000 Series

Introduction

Air Products has developed a unique family of thermoplastic, water-soluble, polyvinyl alcohol resins. These resins, designated by the trademark Vinex, have all the chemical, physical and mechanical properties of polyvinyl alcohol, including biodegradability, and the melt processability characteristics of a conventional thermoplastic. Vinex resins can be extruded or coextruded into cast or tubular blown film with excellent tensile strength and dimensional stability. They are heat and impulse sealable. They can also be injection or blow molded into water soluble bottles and other articles. Vinex resins can be melt spun into fiber for industrial or personal care applications. The combination of polyvinyl alcohol performance and melt processability can provide competitive advantages to a broad range of end uses. Resin converters, especially those engaged in extrusion processing, can now exploit the performance properties that only polyvinyl alcohol provides, and can introduce novel structures that will afford significant product differentiation in the marketplace.

Vinex 1000 Resin Series

Vinex 1000 series are cold water insoluble resins featuring excellent mechanical and chemical properties and water solubility above 100°F. They are structurally similar to fully hydrolyzed polyvinyl alcohol. Articles fabricated from these resins exhibit properties such as high tensile strength, good adhesion to cellulosics, resistance to solvents, grease and oils, and heat sealability. Vinex 1000 can be converted into cast or blown films for use in numerous packaging applications. For example, hospital laundry bags made by heat sealing blown film can eliminate exposure to biologically contaminated clothing and bedding. Cold water resistance is achieved by proper downstream processing to impart high levels of crystallinity. Other Vinex grades do not crystallize as readily. Typical properties of Vinex 1003 resin are summarized in the adjacent table.

| Properties | Units | V1003 |
|---|---|---|
| Specific gravity, solid | | 1.23 |
| Water absorption, equilibrium at 50% RH | % | 15 |
| Melt Flow 2.16 kg at 230°C | gm/10 min | 9 |
| Thermal Melting range (max) | °C | 150-230 (206) |
| Crystallinity | % | 44.9 |
| Mold shrinkage | in/in | 0.01 |
| Break up in water | seconds/ml | (ins) |
| Dissolution in water | seconds/ml | (ins) |
| Tensile Strength 125 mil Break at 50% RH | psi | 5,700 |
| Tensile Modulus 125 mil 50% RH | psi | 103,000 |
| Elongation 125 mil 50% RH | % | 293 |
| Unnotched Izod Impact 125 mil 50% RH | ft-pd/in | 7.1 |
| Oxygen Transmission 1.2 mil | | |
| 0% RH/760 mm Hg | cc/100 in²/24 hr | 0.0350 |
| 50% RH/760 mm Hg | cc/100 in²/24 hr | 0.0427 |
| 90% RH/760 mm Hg | cc/100 in²/24 hr | 1.2350 |
| Resistivity surface 0% RH | Ω/sq | $2 \times 10^{15}$ |
| 50% RH | | $6 \times 10^{12}$ |
| volume 0% RH | Ω cm | $4 \times 10^{11}$ |
| 50% RH | | $3 \times 10^{8}$ |

All tests performed at 25°C except where noted.

Processing

Vinex 1000 resins can be processed on typical plastics processing equipment such as a polyethylene screw with a 2.5:1 compression ratio, square pitch, and 24 diameters long. Start up conditions on the barrel are typically 195 - 220°C while maintaining the melt below 225°C. Extruder venting or resin drying is not required if the resin is not exposed to atmospheric humidity. Four hours at 50°C is recommended if the resin absorbs moisture. In some applications that require processing through equipment with residence times greater than three minutes, it is desirable to minimize stagnant flow regions by streamlining transitions. This will reduce polymer overheating that can result in darkening of the polymer or gel formation.

Biodegradability

Studies by Air Products demonstrate that Vinex resins are totally assimilated by microorganisms after 20 days. These respirometer experiments were conducted at 25°C in deionized water and the total organic carbon was supplied by Vinex resins. The microorganisms were obtained from an activated sludge sample at our Calvert City polyvinyl alcohol plant and were acclimated to polyvinyl alcohol.

Additional Information

For additional technical information on thermoplastic polyvinyl alcohol copolymers, contact Air Products Customer Services at 1-800-345-3148.

Air Products and Chemicals, Inc.
Polymer Chemicals Division
Allentown, PA 18195 U.S.A.
Telephone (215) 481-6799
TWX 510-651-3686 Telex 84-7416
Cable-AIRPROD
FAX (215) 481-5900

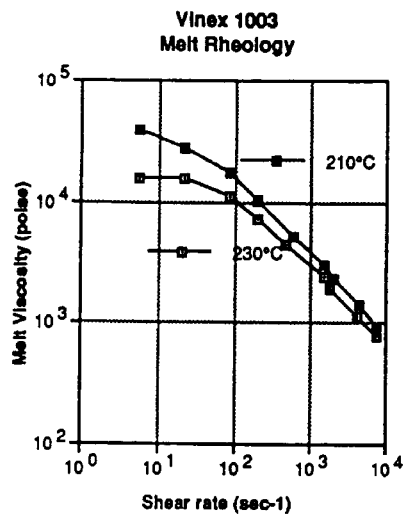

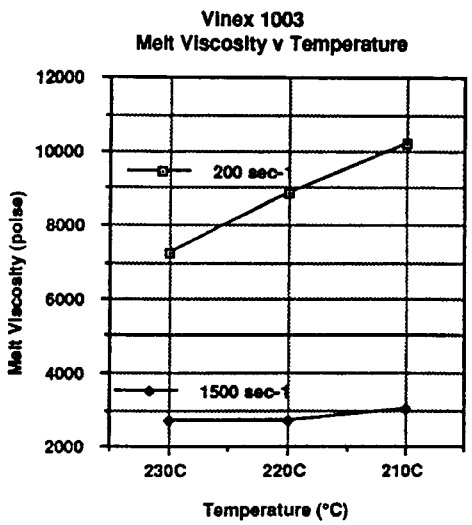

The information contained herein is offered without charge for use by technically qualified personnel at their discretion and risk. All statements, technical information and recommendations contained herein are based on tests and data which we believe to be reliable, but the accuracy or completeness thereof is not guaranteed and no warranty of any kind is made with respect thereto.

Polymer Chemicals Technical Bulletin
Vinex™ Thermoplastic Polyvinyl Alcohol Copolymer Resins
2000 Series

Introduction

Air Products has developed a unique family of thermoplastic, water-soluble, polyvinyl alcohol resins. These resins, designated by the trademark Vinex, have all the chemical, physical and mechanical properties of polyvinyl alcohol, including biodegradability, and the melt processability characteristics of a conventional thermoplastic. Vinex resins can be extruded or coextruded into cast or tubular blown film with excellent tensile strength and dimensional stability. They are heat and impulse sealable. They can also be injection or blow molded into water soluble bottles and other articles. Vinex resins can be melt spun into fiber for industrial or personal care applications. The combination of polyvinyl alcohol performance and melt processability can provide competitive advantages to a broad range of end uses. Resin converters, especially those engaged in extrusion processing, can now exploit the performance properties that only polyvinyl alcohol provides, and can introduce novel structures that will afford significant product differentiation in the marketplace.

Vinex 2000 Resin Series

Vinex 2000 series are cold water soluble resins featuring excellent mechanical and chemical properties. Vinex 2000 resins are structurally similar to partially hydrolyzed polyvinyl alcohol. Articles fabricated from these resins exhibit properties such as, high tensile strength, good adhesion to cellulosics, resistance to solvents, grease and oils, and heat sealability. They can be converted into cast or blown films or injection blow molded into containers for numerous packaging applications such as agricultural chemicals where solvent resistance and safe disposal of the container is required. Typical properties of Vinex 2000 resin are summarized in the adjacent table.

| Properties | Units | V2025 | V2034 |
|---|---|---|---|
| Specific gravity, solid | | 1.23 | 1.23 |
| Water absorption, equilibrium at 75% RH | % | 18 | 16 |
| Melt Flow 2.16 kg at 230°C | gm/10 min | 17 | 10 |
| Thermal Melting range (max) | °C | 140-200 (181) | 120-200 (179) |
| Crystallinity | % | 23.9 | 24.0 |
| Mold shrinkage | in/in | 0.01 | 0.01 |
| Break up in water | seconds/mil | 2.3 | 4.2 |
| Dissolution in water | seconds/mil | 28.8 | 25.2 |
| Tensile Strength 125 mil Break at 50% RH | psi | 4,600 | 5,500 |
| Tensile Modulus 125 mil 50% RH | psi | 216,000 | 104,000 |
| Elongation 125 mil 50% RH | % | 80 | 335 |
| Unnotched Izod Impact 125 mil 50% RH | ft-pd/in | 1.0 | 3.9 |
| Oxygen Transmission 1.3 mil 0% RH/760 mm Hg | cc/100 in²/24 hr | | 0.0435 |
| 50% RH/760 mm Hg | cc/100 in²/24 hr | | 0.1375 |
| 90% RH/760 mm Hg | cc/100 in²/24 hr | | 3.5550 |
| Resistivity surface 0% RH | Ω/sq | $2 \times 10^{15}$ | $6 \times 10^{15}$ |
| 50% RH | | $2 \times 10^{10}$ | $2 \times 10^{9}$ |
| volume 0% RH | Ω cm | $6 \times 10^{11}$ | $3 \times 10^{11}$ |
| 50% RH | | $1 \times 10^{6}$ | $5 \times 10^{5}$ |

All tests performed at 25°C except where noted.

Processing

Vinex 2000 resins can be processed a general purpose screw with a 3:1 compression ratio, square pitch, and 24 diameters long. Start up conditions on the barrel are typically 195 - 220°C while maintaining the melt below 225°C. Extruder venting or resin drying is not required if the resin is not exposed to atmospheric humidity. Four hours at 50°C is recommended if the resin absorbs moisture. In some applications that require processing through equipment with residence times greater than three minutes, it is desirable to minimize stagnant flow regions by streamlining transitions. This will reduce polymer overheating that can result in darkening of the polymer or gel formation.

Biodegradability

Studies by Air Products demonstrate that Vinex resins are totally assimilated by microorganisms after 20 days. These respirometer experiments were conducted at 25°C in deionized water and the total organic carbon was supplied by Vinex resins. The microorganisms were obtained from from an activated sludge sample at our Calvert City polyvinyl alcohol plant and were acclimated to polyvinyl alcohol.

Additional Information

For additional technical information on thermoplastic polyvinyl alcohol copolymers, contact Air Products Customer Services at 1-800-345-3148.

Air Products and Chemicals, Inc.
Polymer Chemicals Division
Allentown, PA 18195 U.S.A.
Telephone (215) 481-6799
TWX 510-651-3686 Telex 84-7416
Cable-AIRPROD
FAX (215) 481-5900

Vinex film manufacturers:

Chase Packaging Corp.
2 Greenwich Plaza
Greenwich, CT 06836-3030
Telephone (203) 637-7000

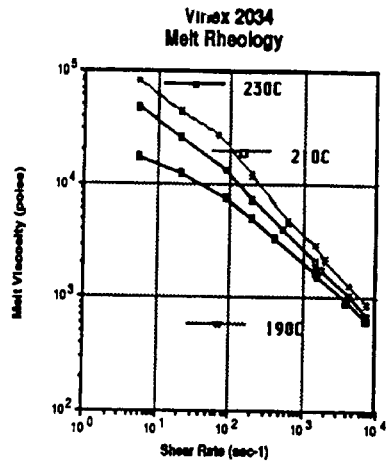

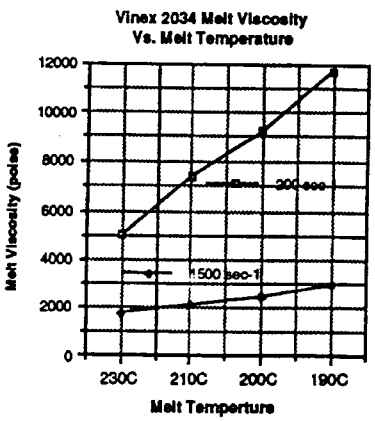

The information contained herein is offered without charge for use by technically qualified personnel at their discretion and risk. All statements, technical information and recommendations contained herein are based on tests and data which we believe to be reliable, but the accuracy or completeness thereof is not guaranteed and no warranty of any kind is made with respect thereto.

 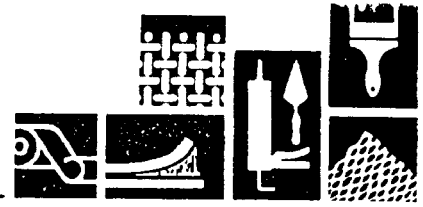

Polymer Chemicals Technical Bulletin

Vinex™ Thermoplastic Polyvinyl Alcohol Copolymer Resins
5000 Series

Introduction

Air Products has developed a unique family of thermoplastic, water-soluble, polyvinyl alcohol resins. These resins, designated by the trademark Vinex, have all the chemical, physical and mechanical properties of polyvinyl alcohol, including biodegradability, and the melt processability characteristics of a conventional thermoplastic. Vinex resins can be extruded or coextruded into cast or tubular blown film with excellent tensile strength and dimensional stability. They are heat and impulse sealable. They can also be injection or blow molded into water soluble bottles and other articles. Vinex resins can be melt spun into fiber for industrial or personal care applications. The combination of polyvinyl alcohol performance and melt processability can provide competitive advantages to a broad range of end uses. Resin converters, especially those engaged in extrusion processing, can now exploit the performance properties that only polyvinyl alcohol provides, and can introduce novel structures that will afford significant product differentiation in the marketplace.

Vinex 5000 Resin Series

Vinex 5000 series are impact modified, cold water soluble resins featuring excellent mechanical and chemical properties. Vinex 5000 resins are structurally similar to partially hydrolyzed polyvinyl alcohol. Articles fabricated from these resins exhibit properties such as, high tensile strength, good adhesion to cellulosics, resistance to solvents, grease and oils, and heat sealability. They can be converted into cast or blown films or injection blow molded into containers for numerous packaging applications such as agricultural chemicals where solvent resistance and safe disposal of the container is required. Typical properties of Vinex 5000 resin are summarized in the adjacent table.

| Properties | Units | V5050 |
|---|---|---|
| Specific gravity, solid | | 1.23 |
| Water absorption equilibrium at 50% RH | % | 16 |
| Melt Flow 2.16 kg at 230°C | gm/10 min | 13.5 |
| Thermal Melting range (max) | °C | 120-185 (177) |
| Crystallinity | % | 17.9 |
| Mold shrinkage | in/in | 0.01 |
| Break up in water | seconds/mil | 7.6 |
| Dissolution in water | seconds/mil | 19.8 |
| Tensile Strength 125 mil Break at 50% RH | psi | 4,500 |
| Tensile Modulus 125 mil 50% RH | psi | 47,000 |
| Elongation 125 mil 50% RH | % | 472 |
| Unnotched Izod Impact 125 mil 50% RH | ft-pd/in | 20.0 |
| Oxygen Transmission 1.5 mil 0% RH/760 mm Hg | cc/100 in²/24 hr | 0.0327 |
| 50% RH/760 mm Hg | cc/100 in²/24 hr | 0.1385 |
| 90% RH/760 mm Hg | cc/100 in²/24 hr | 1.8750 |
| Resistivity surface 0% RH | Ω/sq | $3 \times 10^{13}$ |
| 50% RH | Ω/sq | $2 \times 10^9$ |
| volume 0% RH | Ω·cm | $4 \times 10^{11}$ |
| 50% RH | Ω·cm | $5 \times 10^8$ |

All tests performed at 25°C except where noted.

Processing

Vinex 5000 resins can be processed a general purpose screw with a 3:1 compression ratio, square pitch, and 24 diameters long. Start up conditions on the barrel are typically 195 - 220°C while maintaining the melt below 225°C. Extruder venting or resin drying is not required if the resin is not exposed to atmospheric humidity. Four hours at 50°C is recommended if the resin absorbs moisture. In some applications that require processing through equipment with residence times greater than three minutes, it is desirable to minimize stagnant flow regions by streamlining transitions. This will reduce polymer overheating that can result in darkening of the polymer or gel formation.

Biodegradability

Studies by Air Products demonstrate that Vinex resins are totally assimilated by microorganisms after 20 days. These respirometer experiments were conducted at 25°C in deionized water and the total organic carbon was supplied by Vinex resins. The microorganisms were obtained from from an activated sludge sample at our Calvert City polyvinyl alcohol plant and were acclimated to polyvinyl alcohol.

Additional Information

For additional technical information on thermoplastic polyvinyl alcohol copolymers, contact Air Products Customer Services at 1-800-345-3148.

Air Products and Chemicals, Inc.
Polymer Chemicals Division
Allentown, PA 18195 U.S.A.
Telephone (215) 481-6799
TWX 510-651-3686 Telex 84-7416
Cable-AIRPROD
FAX (215) 481-5900

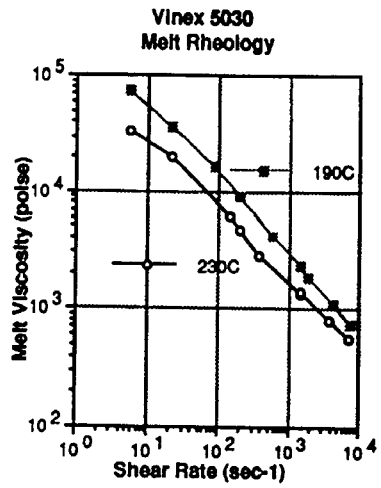

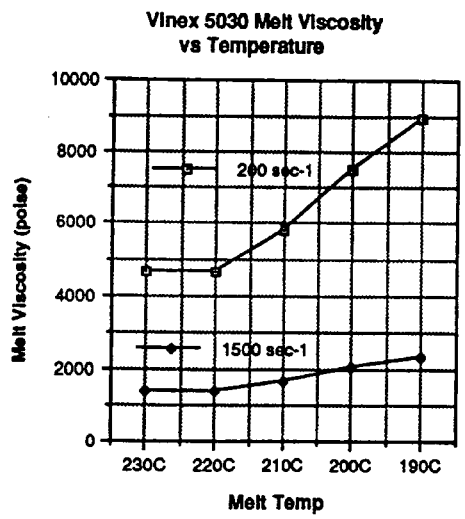

The information contained herein is offered without charge for use by technically qualified personnel at their discretion and risk. All statements, technical information and recommendations contained herein are based on tests and data which we believe to be reliable, but the accuracy or completeness thereof is not guaranteed and no warranty of any kind is made with respect thereto.

What is claimed is:

1. A removable, non-brittle, water soluble thermoplastic spacer for use to space an electrical component from a printed wiring board to which the electrical component will be attached which comprises:
   (a) a shaped mixture of
      (i) an injection moldable solid mixture of partially hydrolyzed polyvinyl alcohol resin, and
      (ii) fully hydrolyzed polyvinyl alcohol resin,
   (b) said mixture being capable retaining its shape at the printed wiring board fabrication and soldering temperatures encountered.

2. The spacer of claim 1 having a ratio of partially hydrolyzed polyvinyl alcohol resin to fully hydrolyzed polyvinyl alcohol resin to provide a selected spacer melting temperature.

3. The spacer of claim 1 having a ratio of partially hydrolyzed polyvinyl alcohol resin to fully hydrolyzed polyvinyl alcohol resin is determined to provide a selected solubility rate of said spacer in water.

4. The spacer of claim 2 having a ratio of partially hydrolyzed polyvinyl alcohol resin to fully hydrolyzed polyvinyl alcohol resin is determined to provide a selected solubility rate of said spacer in water.

5. The spacer of claim 1 wherein said partially hydrolyzed polyvinyl alcohol resin is water soluble and moldable and is about 88% hydrolyzed with a melting range between 120° C. and 200° C. and exhibits up to 24% crystallinity and said fully hydrolyzed polyvinyl alcohol resin is moldable and is about 98% hydrolyzed with a melting range between 150° C. and 230° C. which exhibits up to 45% crystallinity.

6. The spacer of claim 2 wherein said partially hydrolyzed polyvinyl alcohol resin is water soluble and moldable and is about 88% hydrolyzed with a melting range between 120° C. and 200° C. and exhibits up to 24% crystallinity and said fully hydrolyzed polyvinyl alcohol resin is moldable and is about 98% hydrolyzed with a melting range between 150° C. and 230° C. which exhibits up to 45% crystallinity.

7. The spacer of claim 3 wherein said partially hydrolyzed polyvinyl alcohol resin is water soluble and moldable and is about 88% hydrolyzed with a melting range between 120° C. and 200° C. and exhibits up to 24% crystallinity and said fully hydrolyzed polyvinyl alcohol resin is moldable and is about 98% hydrolyzed with a melting range between 150° C. and 230° C. which exhibits up to 45% crystallinity.

8. The spacer of claim 4 wherein said partially hydrolyzed polyvinyl alcohol resin is water soluble and moldable and is about 88% hydrolyzed with a melting range between 120° C. and 200° C. and exhibits up to 24% crystallinity and said fully hydrolyzed polyvinyl alcohol resin is moldable and is about 98% hydrolyzed with a melting range between 150° C. and 230° C. which exhibits up to 45% crystallinity.

9. The spacer of claim 1 wherein said spacer is in the shape of a toroid.

10. The spacer of claim 1 further including a printed wiring board having an aperture therein, said spacer disposed about said aperture, and an electrical component having a wire extending therefrom, said electrical component resting on said spacer and said wire extending through said spacer and into said aperture.

11. A removable, non-brittle, water soluble thermoplastic spacer for use to space an electrical component from a printed wiring board to which the electrical component will be attached which comprises:
   (a) an injection moldable member having a central aperture extending therethrough
   (b) of a water soluble thermoplastic polymer
   (c) which retains its shape at the printed wiring board fabrication and soldering temperatures encountered.

12. The spacer of claim 11 further including said printed wiring board, said board having an aperture therein, said spacer disposed on said board and around said aperture in said board.

13. The spacer of claim 12 further including an electrical component disposed over said spacer, said electrical component having a wire extending therefrom and disposed through said aperture in said spacer and into said aperture in said board.

14. The spacer of claim 11 wherein said molded member is a toroid.

15. The spacer of claim 12 wherein said molded member is a toroid.

16. The spacer of claim 13 wherein said molded member is a toroid.

* * * * *